United States Patent [19]

Ozawa et al.

[11] Patent Number: 4,827,328
[45] Date of Patent: May 2, 1989

[54] HYBRID IC DEVICE

[75] Inventors: Takashi Ozawa, Tokyo; Ichiro Munakata, Kawasaki; Hiroaki Takagi; Ryoichi Kozaki, both of Kawasaki, all of Japan

[73] Assignee: Fujitsu Limited, Kawasaki, Japan

[21] Appl. No.: 26,972

[22] Filed: Mar. 17, 1987

[30] Foreign Application Priority Data

Mar. 17, 1986 [JP] Japan .................. 61-058715

[51] Int. Cl.⁴ .......................... H05K 01/16
[52] U.S. Cl. .................. 357/80; 174/52.2; 174/68.5; 361/402; 427/97
[58] Field of Search .......... 174/68.5; 357/80; 427/97; 361/402

[56] References Cited

U.S. PATENT DOCUMENTS

| | | | |
|---|---|---|---|
| 3,745,095 | 7/1973 | Chadwick et al. | 427/97 X |
| 4,080,513 | 3/1978 | Cuneo et al. | 174/68.5 |
| 4,437,140 | 3/1984 | Ohyama et al. | 361/402 |
| 4,446,477 | 5/1984 | Currie et al. | 357/80 X |
| 4,628,598 | 12/1986 | Taylor | 174/68.5 X |
| 4,639,290 | 1/1987 | Leyden et al. | 427/97 X |
| 4,659,587 | 4/1987 | Imura et al. | 427/97 |

FOREIGN PATENT DOCUMENTS 59-159592 9/1984 Japan.
60-21589 2/1985 Japan.
60-201688 10/1985 Japan.

OTHER PUBLICATIONS

Norwood et al., Manufacturing Process for Hybrid Microcircuits Containing Vias, IEEE Transactions on Parts, Hybrids & V. PHP-1, #4, pp. 323-335, Dec. 1976.

Primary Examiner—R. R. Kucia
Attorney, Agent, or Firm—Staas & Halsey

[57] ABSTRACT

A compact and dense hybrid integrated circuit device which can be encapsulated by transfer molding can be manufactured by forming through holes in a ceramic or glass substrate, which through holes have a diameter of less than 0.2 mm, preferably less than 0.1 mm, a thin film circuit element being formed on one surface of the substrate, and a thin or thick film circuit element being formed on the other surface of the substrate. A fine through hole as mentioned above can be formed by laser drilling, etc., and plating.

13 Claims, 9 Drawing Sheets

THROUGH-HOLE /
Cu PLATING

100μ

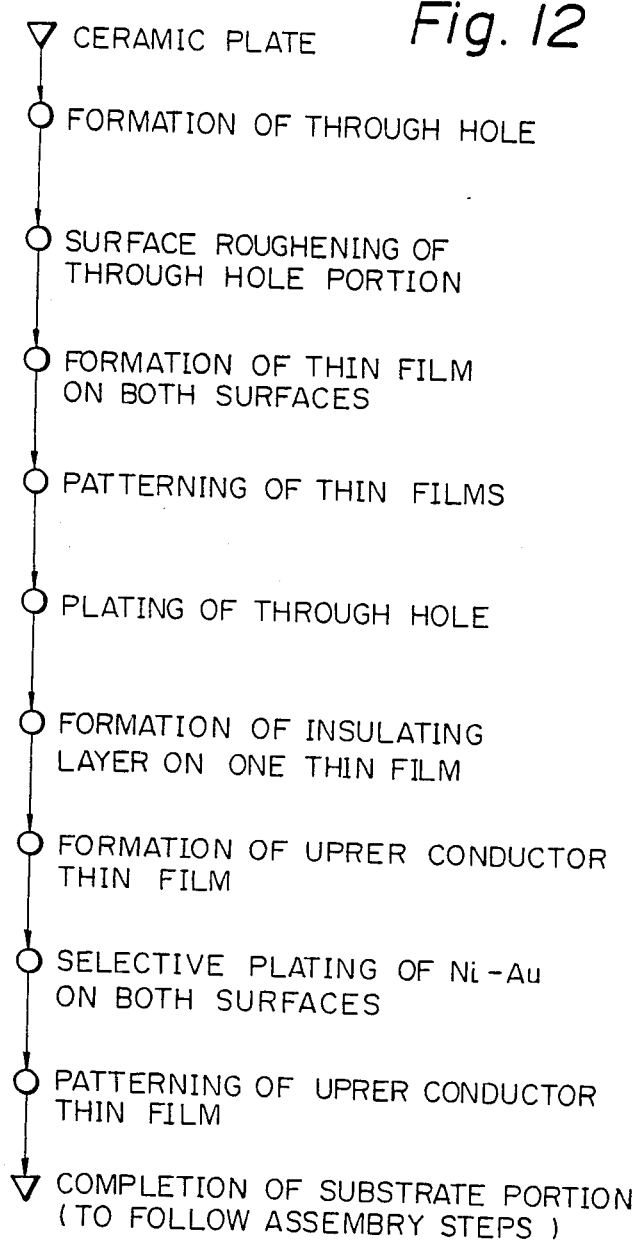

HYBRID IC DEVICE

BACKGROUND OF THE INVENTION

1. Field of the Invention

The present invention relates to a hybrid integrated circuit device having circuit elements formed and mounted on a circuit substrate. More particularly, the present invention is intended to provide a standerdizable small-size dense hybrid integrated circuit device adopted for surface mounting. The present invention also relates to a method for manufacturing such a hybrid integrated circuit device.

2. Description of the Related Art

In electronic installations represented by information processing devices, the expansion of the field of application and increase of the quantities of information to be processed, make a further increase of the function, capacity, and operation speed necessary.

To satisfy this requirement, an increase of the integration degree and operation speed in semiconductor devices and an improvement of the assembling technique for reducing the wiring length and increasing the packaging density in devices are effective and important.

As means for increasing the packaging density in devices, there have been broadly adopted a chip-on-board method such as a flip chip, wire bonding or film carrier, in which a bare chip is directly mounted on a wiring substrate, and a method in which a surface package part having a small size such as a leedless carrier of flat package is used.

According to this high-density packaging technique, circuit elements such as wirings are formed on a circuit substrate and individual circuit elements are mounted to construct a hybrid integrated circuit having a high density, and hybrid integrated circuits having a high capacity and high performance have been produced by utilizing this packaging technique.

In hybrid integrated circuits, efforts have been made to increase the wiring density by adopting a multi-layer forming technique and a fine patterning technique, but a prominent effect cannot be attained by a wiring method or structure utilizing only one of the thick film forming technique and the thin film forming technique.

FIG. 1 is a sectional side view illustrating an example of the structure of a hybrid integrated circuit according to the conventional technique, and FIG. 2 is an enlarged sectional side view illustrating an electrode for connection of an external lead terminal of the hybrid integrated circuit shown in FIG. 1.

Referring to FIG. 1, circuit elements are formed on both surfaces of a circuit substrate and are connected by through holes in a hybrid integrated circuit 1. More specifically, this conventional hybrid integrated circuit 1 comprises a circuit substrate 2 having a plurality of through holes 3, and circuit elements 4 composed of wirings and circuit parts having a film structure are formed on the upper and lower surfaces of the circuit substrate 2, discrete circuit elements 5 are then mounted, an outer lead terminal 6 having an end portion gripped on the circuit substrate 2 is connected, a ceramic cap 10 is mounted, and a resin outer casing 7 is disposed to complete the manufacturing process.

Where a circuit element 5 is a bare chip 5a, in order to protect the bare chips 5a and fine metal wires 8 connected to the bare chips 5a, a coating resin is potted to form a protecting layer 9, before attachment of the outer casing 7.

If, as shown in FIG. 2, the circuit element 4 is a thick-film multi-layer wiring and an electrode 11 to which the outer lead terminal 6 is connected is a laminate comprising a conductor layer 4a covered on the circuit substrate 2 and a conductor layer 4b formed in the upper portion of the circuit element 4, the conductor layer 4b is formed in the step portion formed in the vicinity of the conductor layer 4a.

When manufacturing this hybrid integrated circuit 1, circuit elements 4 are formed by either the thick film-forming method or the thin film-forming method on an insulating plate, such as an alumina ceramic plate, having a large such size that a plurality of circuit substrates 2 can be taken out.

The ceramic plate is then divided into individual substrates 2, the desired circuit elements 5 are mounted, and the protecting layer 9 is covered on the predetermined mounted circuit element 5a (for example, the bare chip). Then, the outer lead terminal 6 is connected and the outer casing 7 is attached, and thus the manufacturing process is completed.

In the formation of circuit elements, with respect to the thick film-forming method based on the screen printing technique, fine pattern printing and wiring of both surfaces using through holes are utilized for improving the packaging density in the multi-layer wiring.

The thick film-forming method and thin film-forming method for forming circuit elements have peculiar advantages, respectively, but these methods have technical limits and cannot further improve the packaging density in a hybrid integrated circuit.

More specifically, since the thick film-forming method uses a conductive paste having a high viscosity, the width of the fine pattern is limited to about 100 $\mu$m or more, and the diameter of the through hole should be at least 0.3 mm even when made by suction printing. Accordingly, it is difficult to stably form fine resistor elements having a size smaller than 0.5 mm $\times$ 0.5 mm over a broad range, and therefore, the wiring region is broadened and an increase of the packaging density is impossible.

Generally, the protecting layer 9 for protecting the bare chip 5a or the like is formed by casting a thermosetting liquid resin and curing the resin by heating. The liquid resin flows around the bare chips 5a and the protecting layer 9 then has an expanded skirt-like shape. Accordingly, if, for example, a bare chip 5a is arranged in the vicinity of the peripheral edge of the substrate 2 and the skirt of the protecting layer 9 covers the dividing line for dividing the above-mentioned large ceramic plate into circuit substrates, the division becomes difficult.

The conventional outer lead terminal 6 extends straight in the sideway from the connecting point to the substrate 2 and the terminal 6 is often broken at the connecting portion to the substrate by an external force applied to the portion extending from the outer casing 7. In the circuit element formed by utilizing the thick film-forming method, if the height of the step between the conductor layer 4b connected to the conductor layer 4a for connection of the outer lead terminal and the conductor layer 4a exceed several tens of $\mu$m, the conductor layer 4b is often cut at this step portion.

A substrate for a hybrid integrated circuit has been proposed, in which a digital circuit is formed on one main surface of the substrate by a thick film-forming method and an analog circuit is formed on the other main surface of the substrate by a thin film-forming method (Japanese Unexamined Patent Publication (kokai) No. 60-21589). This is intended only to provide a design of a substrate adopted for each digital and analog circuit, and does not provide a method for making through holes suitable for allowing a hybrid integrated circuit to be as dense as that according to the present invention. This substrate is ground or glazed to provide a smooth surface suitable for a thin film circuit to be formed thereon, but such a substrate is practically not suitable for a thin film circuit or a later process incorporating a high temperature treatment. Discrete parts are mounted on the substrate, by soldering only, which does not allow the hybrid integrated circuit to be made dense. And finally, this proposal does not allow the hybrid integrated circuit to be encapsulated by transfer molding, for which the area of the substrate must be less than about 1.5 cm by about 1.5 cm.

Also proposed is s substrate for a hybrid integrated circuit in which a thick film pattern is formed on a main surface of the substrate and a thin film pattern is formed on the other main surface of the substrate, the other main surface of the substrate being ground (Japanese Unexamined Publication (Kokai) No. 60-201688). This suffers from the same problems as in the above proposal.

There is further proposed a method for manufacturing a ceramic substrate, comprising forming holes in the ceramic plate by supersonic or laser beam, nonelectroless plating the substrate followed by electrolytic plating, and selectively etching the plating layer (Japanese Unexamined Patent Publication (kokai) No. 59-159592). In this method, not only the surface of the through holes but also both main surfaces of the substrate are roughened before plating. This means that the substrate is not suitable for forming a thin film circuit thereon. Although not mentioned, laser drilling of a ceramic plate has been carried out by a $CO_2$ laser having a high power in the prior art, and the $CO_2$ laser gives a relatively large size hole, such as more than 0.3 $\mu$m. Even if the $CO_2$ laser beam is converged to an area with a small diameter, control of the diameter is difficult due to a long wavelength of the $CO_2$ laser light, resulting in an undesirable shape of the holes formed in the ceramic plate.

SUMMARY OF THE INVENTION

The main object of the present invention is to provide a compact and dense hybrid integrated circuit device adopted for surface mounting technology (SMT).

Another object of the present invention is to provide a compact and dense hybrid integrated circuit device adopted for making a package thereof by transfer molding.

The above and other objects of the present invention are attained by providing a hybrid integrated circuit device, comprising: an insulating substrate having two parallel main surfaces adopted for formation of a thin film circuit thereon, at least one of the two main surfaces not being roughened, the insulating substrate being provided with piercing holes penetrating from one to the other of the two main surfaces of the substrate and having a diameter of less than 0.2 mm, preferably less than 0.1 mm, the surface of the piercing holes of the substrate being roughened; first and second film circuits formed on the two main surfaces of the substrate, wherein the first and/or second film circuits formed on the at least one roughened surface of the two main surfaces of the substrate is/are thin film circuit or circuits; a plated metal layer formed on the roughened surface of the piering holes and electrically connecting the first and second film circuits; and a semiconductor chip mounted on at least one of the first and second film circuits.

According to the present invention, the through holes formed in the ceramics or glass substrate by laser drilling and plating have a small diameter such as less than 0.2 mm, preferably less than 0.1 mm. This feature, together with other features of the present invention, allows the provision of a compact and dense hybrid integrated circuit device adopted for surface mounting technology, and preferably, for transfer molding packaging. At present, the thin film circuit is generally necessary when providing film resistors, which allow a hybrid integrated circuit including those resistors to be densely integrated. Generally, a thin film is more suitable than a thick film for making a fine pattern. It is, however, easier to make a multilayer structure from thick film than from thin film. Therefore, a hybrid integrated circuit device in which a thin film circuit including film resistors is formed on one side of the substrate and a thick film multilayered circuit on the other side of the substrate, the thick film multilayer circuit being adopted for receiving discrete semiconductor chips with many electrodes, is preferable. Further, a hybrid integrated circuit device in which a thin film circuit including film resistors is formed on one side the substrate and a thin film multilayered circuit on the other side of the substrate, is also preferable.

In another aspect of the present invention, there is provided a method for manufacturing a hybrid integrated circuit device, comprising the steps of: preparing an insulating substrate having two parallel main surfaces adopted for forming a thin film circuit thereon; forming through holes penetrating from one to the other main surfaces of the substrate and having a diameter of less than 0.2 mm; selectively making a portion of the surface of the substrate rough, in which at least the surface of the through holes is made rough but at least one of the two main surfaces of the substrate is not made rough; plating the surface of the through holes; forming a thin film circuit on the at least one unroughened main surfaces of the substrate and forming a thick film circuit on the roughened main surface of the substrate, if present; mounting discrete elements including semiconductor chips and capacitors onto the circuits on the main surfaces of the substrate; and providing outer leads to the substrate, these outer leads being electrically connected to at least one of the circuits on the two main surfaces of the substrate.

BRIEF DESCRIPTION OF THE DRAWING

FIG. 12 is a step diagram illustrating the main steps of manufacturing a hybrid integrated circuit according to another embodiment of the present invention.

DESCRIPTION OF THE PREFERRED EMBODIMENTS

Figure 1:
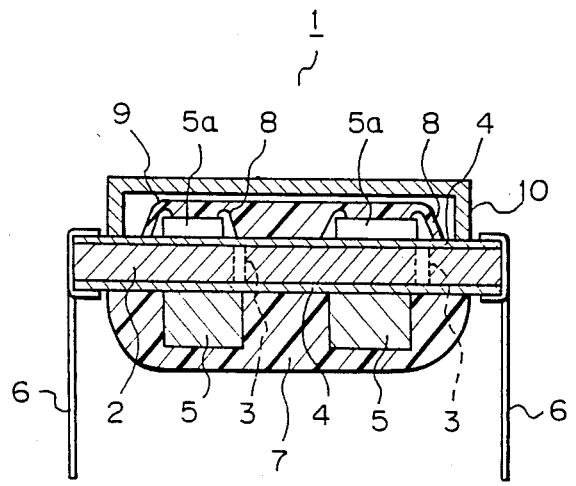
FIG. 1 is a sectional side view illustrating a hybrid integrated circuit according to a conventional technique.
Figure 2:
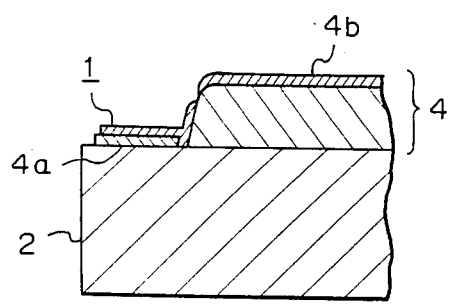
FIG. 2 is an enlarged sectional side view illustrating an electrode for connection of an outer lead terminal of the conventional hybrid integrated circuit.
Figure 3A:
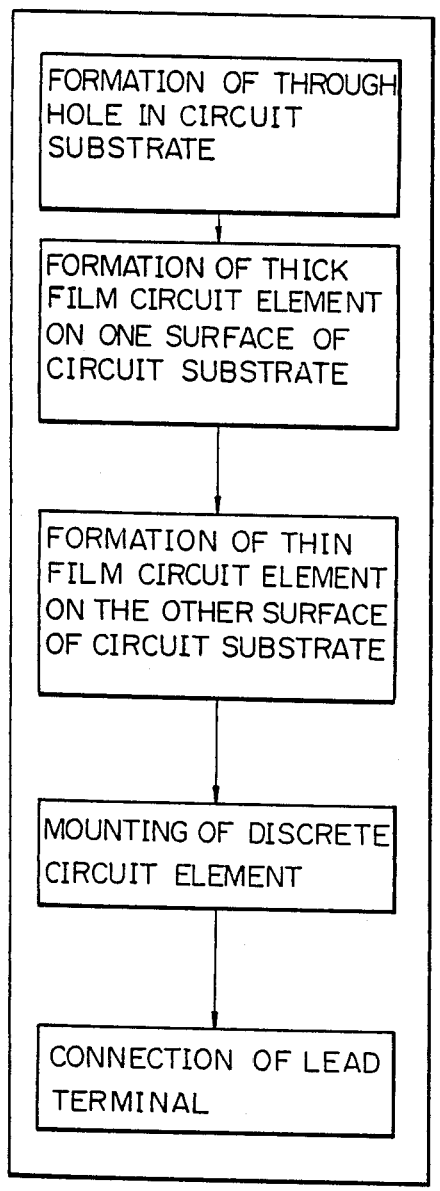
FIG. 3 illustrates basic steps (a) of forming a hybrid integrated circuit according to one embodiment of the present invention and includes side views (b) corresponding to the main parts of the basic steps.
Figure 3B:
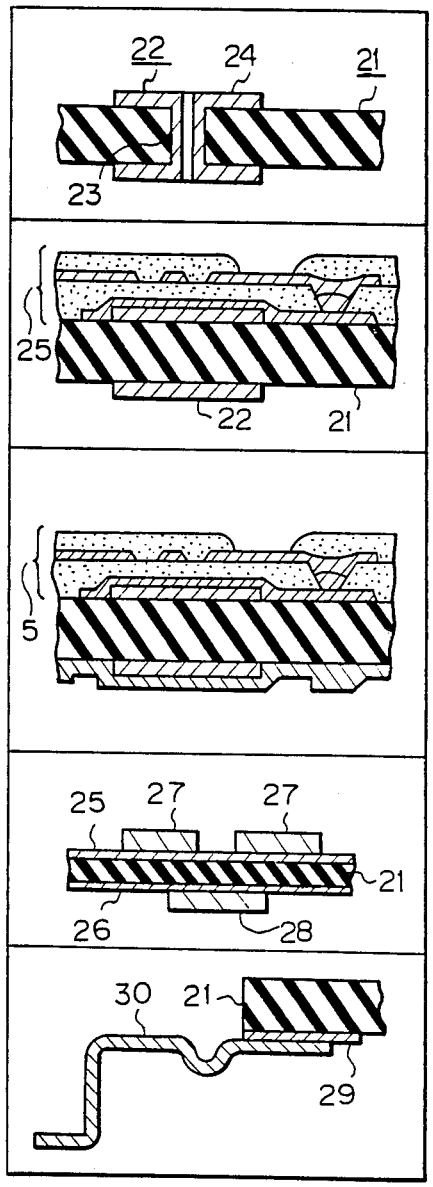

FIG. 3 shows the basic steps of manufacturing a hybrid integrated circuit device according to one embodiment of the present invention (FIG. 3(a)), and includes side views of the hybrid integrated circuit corresponding to the main parts of the basic steps (FIG. 3(b)).

Referring to FIG. 3, a through hole 22 is formed in a ceramic substrate 21 by opening a piercing hole 23 by layer drilling, supersonic drilling or the like and covering the piercing hole 23 with a conductor layer 24 by electroless plating and electrolytic plating. The substrate may be of glass, glass ceramics or glass-coated ceramics in place of the ceramics.

Then, a multilayer circuit element 25 having a desired conductor layer connected to the through hole 22 is formed on one surface (the upper surface in the drawings) of the substrate 21, and a thin film circuit element 26 having a desired conductor layer connected to the through hole 22 is formed on the other surfaces (the lower surface in the drawings) of the substrate 21. The multilayer circuit element 25 may be either a thick on thin film circuit element according to the present invention.

Then, circuit elements 27 and 28 such as bare chips are mounted on the substrate 21, and outer lead terminals 30 are connected to the outer connection electrode 29 of the substrate 21.

Figure 4:
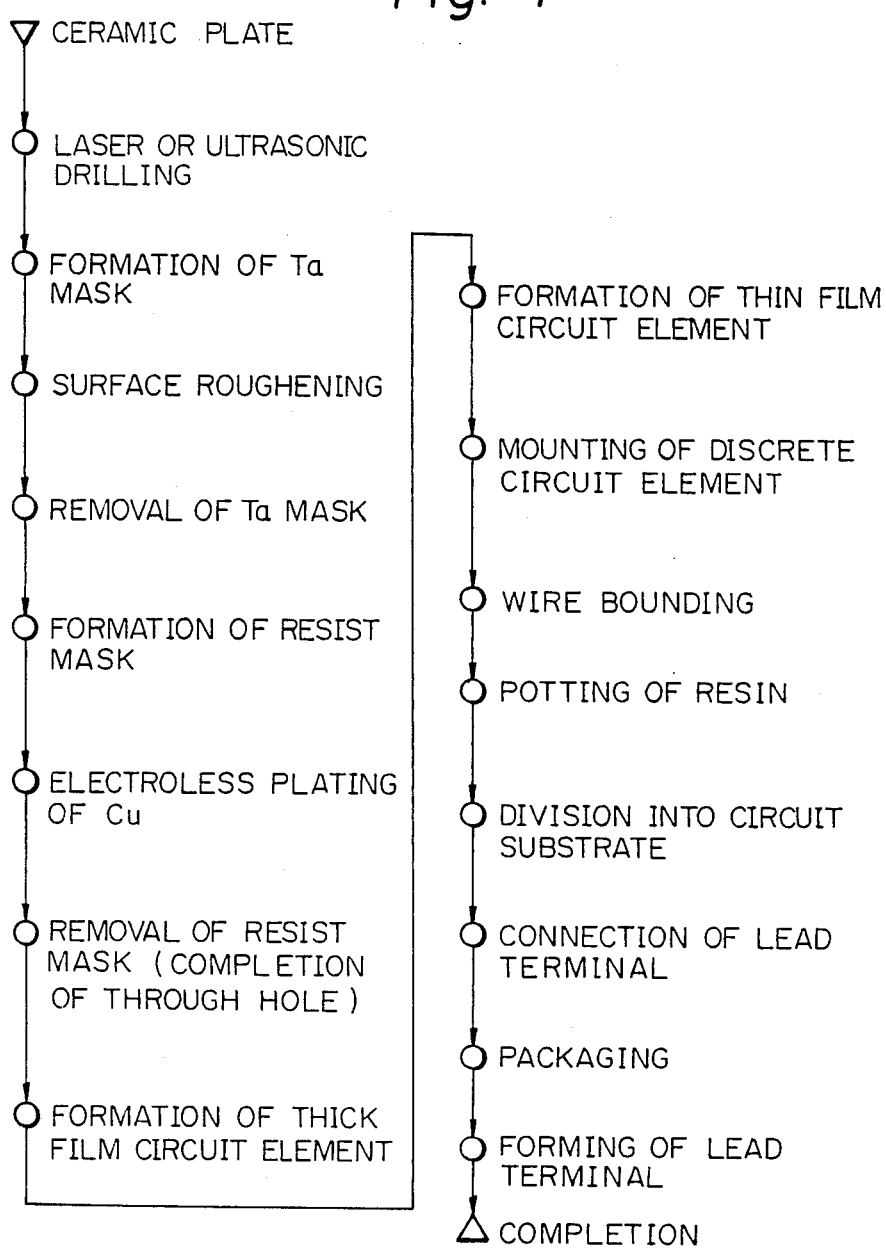
FIG. 4 is a partially cut-out sectional side view showing the hybrid integrated circuit according to one embodiment of the present invention.

Referring to FIG. 4, in which the same reference numerals as in FIG. 3 represent the same members or elements in FIG. 3, a hybrid integrated circuit 31 comprises a ceramic circuit substrate 21 having a through hole 22, a multilayer circuit element 25 including a multi-layer wiring, which is formed on the upper surface of the circuit substrate 21, a thin film circuit element 26 including usually a thin film resistor and optionally a capacitor, formed on the lower surface of the circuit substrate 21, a bare chip (discrete circuit element) 27 mounted on the circuit element 25, a discrete circuit element 28 such as a ceramic capacitor mounted on the circuit element 26, an outer lead terminal 30 connected to the end portion of the lower surface of the circuit substrate 21, and an outer casing 32.

Before formation of the outer casing 32, the bare chip 27 is electrically connected to the circuit element 25 with a fine metal wire 33 and, optionally, a protecting layer 63 is then formed.

Figure 5:
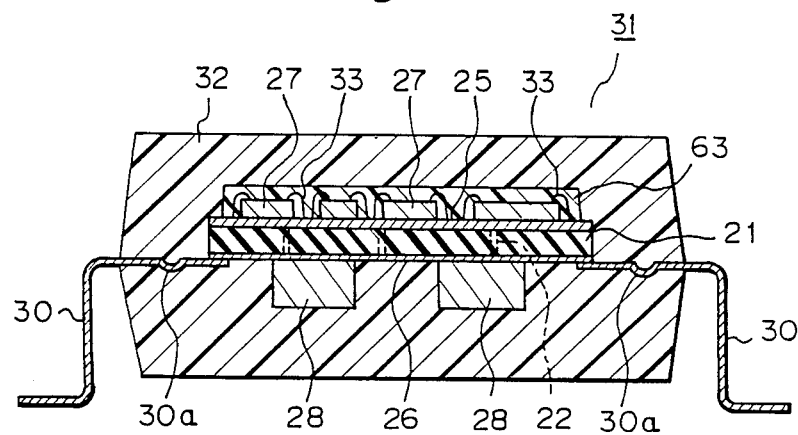
FIG. 5 is an enlarged sectional side view illustrating the main part of the hybrid integrated circuit.

Referring to FIG. 5, the multilayer circuit element 25, a thick film circuit element in this case, formed on the upper surface of the circuit substrate 21 has a multilayer structure comprising a conductor layer 25a (hatched in the drawings) and an insulating layer 25b (dotted and hatched in the drawings), and an electrode of the bare chip 27 is connected to an electrode portion 25c exposed to the surface of the circuit element 25 through the fine metal wire 33, and the predetermined conductor layer 25a is connected to the through hole 22.

The thin film circuit element 26 has a laminate structure comprising a resistor layer such as Ta layer 26a, a conductor layer 26b, and an insulating layer 26c, and the predetermined conductor layer 26b is connected to the through hole 22 and an electrode 28a of the mounted individual element 28 is connected to an exposed portion 26d of the conductor layer 26b.

In a preferred embodiment, the multilayer circuit element 25 comprises only a multilayer wiring structure on which discrete bare semiconductor chips 27 are mounted, the chips 27 being electrically connected to the multilayer circuit element 25 by wire bonding, and the thin film circuit element 26 comprises only thin film resistors and a wiring layer on which discrete capacitors 28 are mounted by soldering. This structure allows the hybrid integrated circuit device to be made denser, so that transfer molding can be utilized in forming a package of the device. Because wire bonding between semiconductor chips can be overlaped to allow mounting denser. Between chip condensers and the film circuit and between soldering pads in the film circuit, fine thin film resistance elements can be arranged to utilize the surface of the substrate more advantageously. If wire bonding and soldering are conducted on the same surface, dispersion of solder or flux residue may affect the reliability of the device, which is solved in the above structure.

The main steps of manufacturing the hybrid integrated circuit 31 from an alumina ceramic plate having a size such that a plurality of circuit substrates 21 can be collected will now be described as well as the structure thereof with reference to FIGS. 6 to 8. In this case, a thick film circuit element is formed on one side of the ceramic plate.

The manufacture of the hybrid integrated circuit 31 starts from a large ceramic plate. This ceramic plate must be one adopted for forming a thin film circuit element thereon. That is, the ceramic plate must have a very smooth surfaces, e.g., a surface roughness of less than 0.3 $\mu$m. For example, an alumina plate with such a smooth surface is commercially available, and usually has a purity of 99.5% or more of alumina.

Through holes 22 are then formed in a large ceramic plate 41 of, e.g., alumina. That is, as shown in FIG. 7-(a), first, piercing holes 23 having a diameter of about 0.1 mm are formed in the ceramic plate 41 by a YAG laser or the like. Then, as shown in FIG. 7-(b), a tantalum (Ta) mask 42 is placed on one side of the ceramic plate 41 except for the portions surrounding the piercing holes 23. The exposed portions of the ceramic plate 41 are then subjected to a surface-roughening treatment, i.e., the inner walls of the percing holes 23, the surrounding portions thereof on the one surface of the substrate, and the entire surface of the other surface of the substrate are etched to form a rough surface having convexities and concavities of, for example, about 1 μm.

Then, the Ta mask 42 is dissolved out, and as shown in FIG.7-(c), a resist 43 is formed on all surfaces except for the inner walls of the piercing holes 23 and the surrounding portions thereof. A conductor (Cu) layer 24a is formed on the surface by electroless plating and a resist 44 is formed thereon, and a conductor (Cu) layer 24b is formed on the exposed conductor layer 24a by electrolytic plating using the conductor layer 24a as the electrode.

This plating allows the formation of through holes having a small diameter, such as less than 0.2 mm, preferably less than 0.1 mm. Conversely, in the prior art method, i.e., screen printing method, only through holes having a diameter of 0.3 to 0.5 mm at lowest are obtained even if suction is simultaneously applied thereto.

When the resist 43 is then removed, as shown in FIG. 7-(d), the conductor layers 24a and 24b covered on the resist 43 are removed (lifted off) and the through hole 22 is completed.

Then, as shown in FIG. 7-(e), the thick film circuit element is formed on one surface (the upper surface in the drawings) of the ceramic substrate 41, and as shown in FIG. 7-(f), the thin film circuit element 26 is formed on the other surface (the lower surface in the drawings) of the ceramic plate 41.

Then, discrete circuit elements 27 and 28 are mounted on the thick film circuit element 25 and thin film circuit element 26, optionally, a resin for protecting the predetermined mounted circuit element 27 and the connecting portion thereof is potted. The ceramic plate 41 is then divided into circuit plates 21. The outer lead terminal 30 is connected to the circuit substrate 21 and the outer casing 32 to which the top end portion of the external lead terminal 30 is attached is formed by, for example, transfer molding, and the outer lead terminal 30 extended from the outer casing 32 is formed. Thus, the hybrid integrated circuit 31 is completed.

Note, in FIG. 4, the outer lead terminal 30 has a U-shaped curved portion 30a formed in the vicinity of the connection portion to the circuit substrate 21. The curved portion 30a acts as a damper against an external force after connection of the outer lead terminal 30 to the circuit substrate 21. Namely, the curved portion 30a protects the connecting portion from an external force at the step of forming the outer casing 32 or forming the outer lead terminal 30 or after actual packaging of the fabricated hybrid integrated circuit.

Figure 8A:
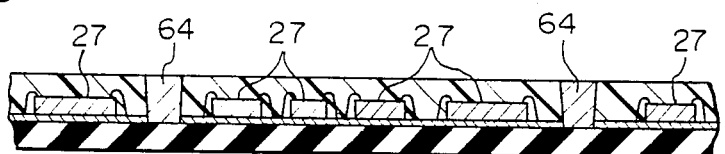
FIG. 8 is a partially cut-out side view illustrating a method of preparing a protecting layer for protecting a bare chip of the hybrid integrated circuit.
Figure 8B:
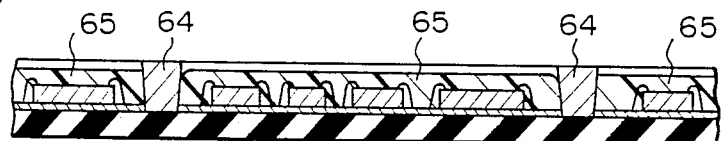
Figure 8C:
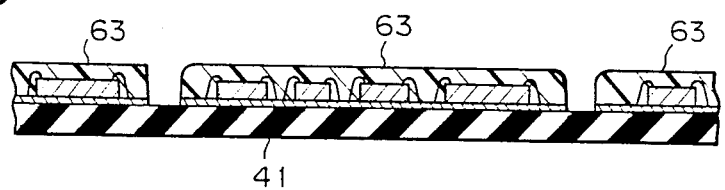

Referring to FIG. 8, in which the same reference numerals as in the foregoing Figures represent the same members or elements, the bare chip 27 mounted on the circuit substrate 21 and the fine metal wire 33 are protected by a protecting layer 63 composed of a packaging resin (a silicone rubber type resin or the like).

Formation of the protecting layer 63 will now be described. At first, as shown in FIG. 8-(a), the four sides of the bare chip 27 are surrounded by a pier 64 mounted on the ceramic plate 41. The section of the pier 64 has a downwardly narrowed trapezoidal shape.

Then, as shown in FIG. 8-(b), a packaging resin liquid 65 is cast in the interior of the pier 64, and when the resin liquid 65 is cured and the pier 64 is removed, a protecting layer 63 is formed on a predetermined region, as shown in FIG. 8-(c).

Figure 9:
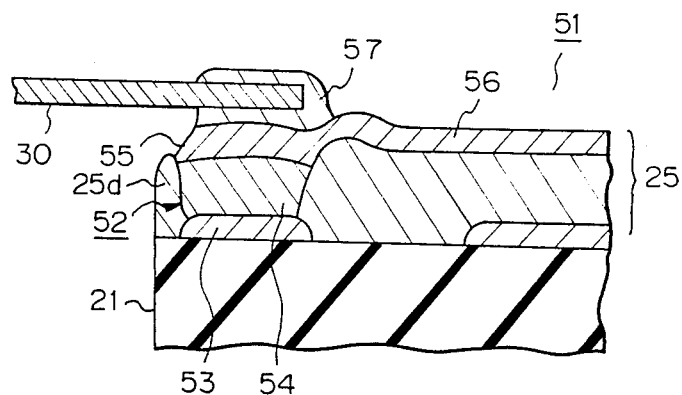
FIG. 9 is an enlarged sectional side view illustrating an external lead terminal connecting portion of a hybrid integrated circuit according to another embodiment of the present invention.

Referring to FIG. 9 in which the same reference numerals as used in the foregoing Figures represent the same members or elements, a hybrid integrated circuit 51 comprises a thick film circuit element 25 formed on the upper surface of a circuit substrate 21, and an outer lead terminal 30 is connected to the end portion of the upper surface of the circuit substrate 21 through a solder layer 57.

An electrode 52 for connection of the outer lead terminal comprises a lower conductor layer 53, a viafil 54, and an upper conductor layer 55 as a part of a wiring 56. The step portion between the lower conductor layer 53 having a thickness of about 10 μm and the thick film circuit element 25 adjacent to the conductor layer 53 is filled with the viafil 54, for example, by surrounding the periphery of the conductor layer 53 by a dielectric layer 25d as a part of the thick film circuit element 25, filling an electroconductive paste in the surrounded portion, and sintering the paste to form the viafil 54, whereby the wiring 56 attached to the thick film circuit element 25 and the viafil 54 are formed substantially on one plane.

Figure 6:
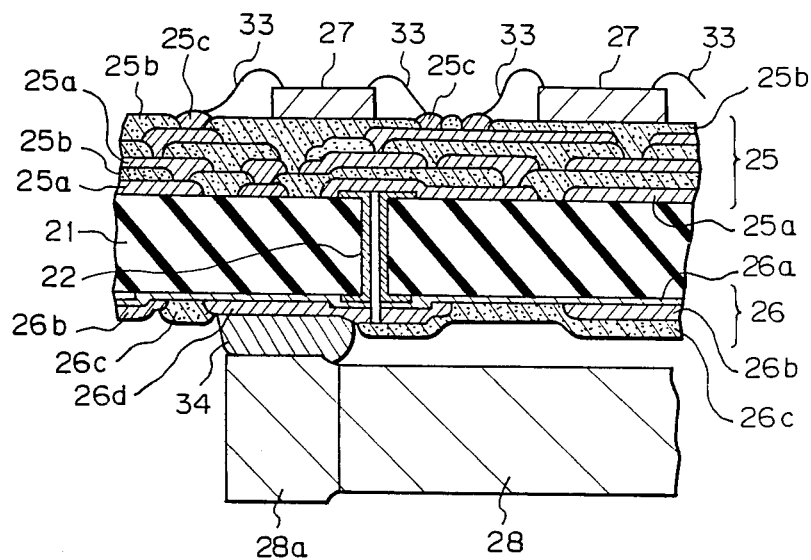
FIG. 6 is a step diagram illustrating the main steps of manufacturing the hybrid integrated circuit.
Figure 7A:
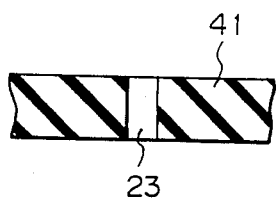
FIG. 7 is a sectional side view of the hybrid integrated circuit, which corresponds to the main parts of the manufacturing steps.
Figure 7B:
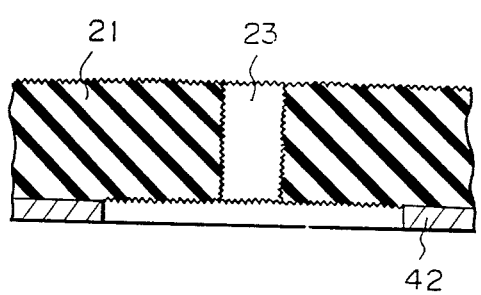
Figure 7C:
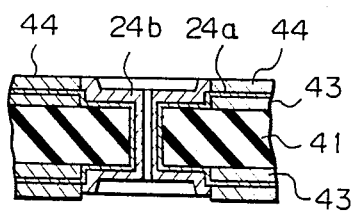
Figure 7D:
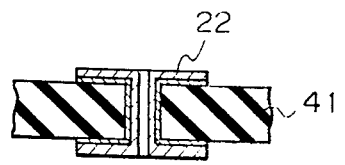
Figure 7E:
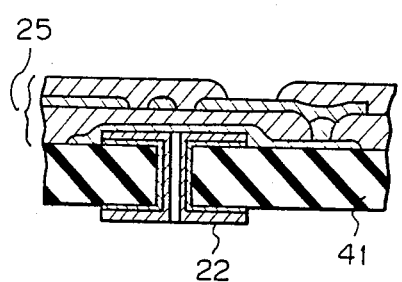
Figure 7F:
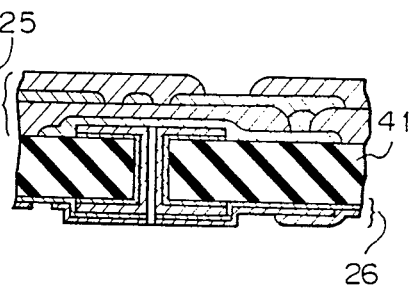

In the embodiment illustrated in FIGS. 6 and 7, the Ta mask 42 is removed after the surface of the substrate has been roughened. However, this Ta mask 42 need not be removed but may be utilized as tantalum pentoxide.

More specifically, the Ta mask is covered and formed except the piercing holes 23 and the surrounding portions thereof, and the Ta mask 42 is then converted to tantalum pentoxide ($Ta_2O_5$) by heat oxidation. Then, the exposed portion of the ceramic plate 21 is subjected to the surface-roughening treatment and a thin film circuit element is formed on the tantalum pentoxide. If these procedures are adopted, a good medium for the forming of circuit elements is provided, since tantalum pentoxide has a smooth surface and a fine pattern can be formed on this smooth surface, and since tantalum pentoxide has a good adhesion to tantalum and nicrome which are used for forming resistances and a conductor.

As is apparent from the foregoing description, according to the above embodiments, by connecting a thick film circuit element formed on one surface of a circuit substrate and a thin film circuit element on the other surface of the circuit substrate by a through hole or a piercing hole having a conductor layer formed thereon by plating means, formation of a through hole having a fine diameter is made possible, and since advantages of both the thick film-forming method and the thin film-forming method are effectively utilized in the obtained hybrid integrated circuit, the density can be increased and the size can be reduced, compared with the conventional hybrid integrated circuit.

Furthermore, by mounting a pier at the step of forming a protecting layer for protecting a bare chip and removing this pier after formation of the protecting layer, the peripheral expansion of the protecting layer caused in the conventional technique is prevented and the freedom in reducing the size of the hybrid circuit and arranging the bare chip is increased. Moreover, by forming a viafil on an electrode for connection of an external lead terminal on the thick film circuit element-formed surface, the reliability is improved.

Note, the present invention is not limited by the foregoing embodiments, but various changes and modifications can be made. For example, other methods such as the etching method can be utilized for forming the conductor layer of the through hole instead of the above-mentioned lift-off method. Moreover, there may be adopted a modification in which a base chip requiring a protecting layer and an individual circuit element not requiring a protecting layer are mounted on one surface of the circuit substrate.

Figure 10:
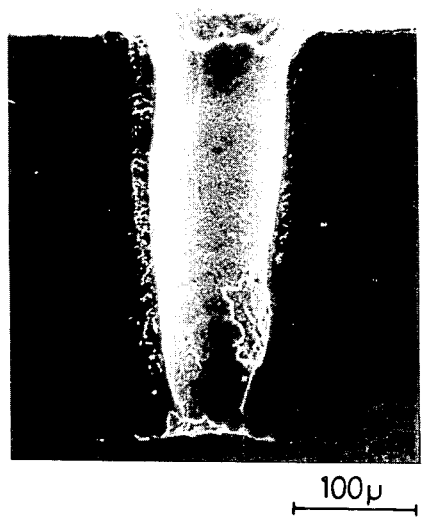
FIG. 10 is a photograph of a section of a through hole.

A $CO_2$ laser is conventionally used for piercing holes in ceramics, etc., but the $CO_2$ laser light has a relatively long wavelength which does not allow the laser beam to be converged to a small diameter even under control. Conversely, a YAG layer, for example, generates a laser light having a relatively short wavelength which allows a beam with a well controlled small diameter such as 0.1 mm or less to be obtained. This allows a piercing hole having a well controlled small diameter such as 0.1 mm or less to be made in a ceramic or glass substrate. Preferably the laser beam is applied to a ceramic or glass substrate in the form of repeated pulses, for example, 5 to 15 times of 200 $\mu$sec pulse, so that a well defined piercing hole is formed. If a laser beam is continuously applied when forming a piercing hole in a ceramic or glass plate, a relatively larger power becomes necessary and the shape of the piercing hole cannot be well defined, i.e., having a slope, etc. FIG. 10 is a photograph of a though hole pierced in an alumina plate having a 0.4 mm thickness by applying a bean from a YAG laser in the form of repeated pulses, and then plated with copper. The formation of the fine through hole is clearly shown in FIG. 10.

According to the above process, a hybrid integrated circuit device comprising thin and thick film circuit elements, was manufactured. This device used an alumina plate 1.0 cm × 1.0 cm in size 0.4 mm in thickness and less than 0.3 $\mu$m in roughness, in which a total of 60 through holes were made, 40 for terminals and 20 for interconnection. In this device, the diameter of the through holes was 0.1 mm, the pitch of the leads was 0.8 mm, and the total number of mounted semiconductor chips was 9, including 8 IC's and one transistor. The package type was a quad flat package adapted for surface mounting and having an outer size was 14×14×3.5 mm. In the prior art, a hybrid integrated circuit device corresponding to the above device according to the present invention had the through holes having a diameter of more than 0.3 mm and a lead pitch of 2.54 mm, was a dual-in-line package, was 48×19×8 mm in the outer size, and was a type adopted for insertion mounting. Thus, according to the present invention, a hybrid integrated circuit device is attained, which can not only be adopted for surface mounting but also can be made to a size having a volume of one eighth of the volume of a corresponding prior art device.

Here, the use of transfer molding is a great advantage, since it is simpler than other packaging methods such as dipping, potting, dispersing, etc., and gives an increased productivity. The hybrid integrated circuit itself usually is not mass produced, but the package thereof can be standardized to be adopted for mass production. In order to use the transfer molding method, the substrate should have a size of generally less than 1.5 cm × 1.5 cm, preferably less than 1.0 cm × 1.0 cm at present.

The basic structure of a hybrid integrated circuit in which a thin film circuit element is formed on each of both surfaces of a substrate as well as a process for manufacturing the same are similar to the structure and the process described above with reference to FIGS. 5 to 9.

Figure 11:
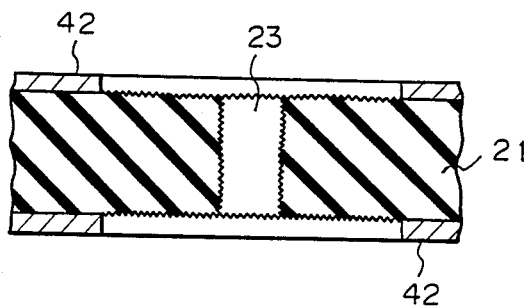
FIG. 11 is a sectional side view of the substrate in a step of manufacturing a hybrid integrated circuit according to a further embodiment of the present invention.

However, in order to form a thin film circuit element on both surfaces of a substrate, the original surfaces of the substrate must be smooth, except for the inner walls of the piercing holes and the surrounding portions thereof, as shown in FIG. 11.

FIG. 12 shows a step diagram of a former part of a process for manufacturing a hybrid integrated circuit comprising a thin film circuit element on both surfaces of a substrate. In this process, after roughening the surfaces of the through holes and the surrounding portions thereof only, and before plating the above-mentioned roughened surfaces, one or more thin films are formed and patterned on each surface of the substrate. That is, on one surface of the substrate, a thin film circuit element comprising film resistors and a wiring layer is formed, and on the other surface of the substrate, a part of a thin film circuit element comprising a wiring layer may be formed although a thin film circuit element comprising film resistors and a wiring layer is also formed thereon. The through hole plating is carried out after a thin film is formed on both surfaces of the substrate, which is different from the process described before with reference to FIGS. 5 to 9. In the process shown in FIGS. 5 to 9, the thick film forming step should be carried out prior to the thin film forming step, since the formation of a Cu thick films requires a reducing atmosphere which would affect the characteristics of the film resistors of a thin film if the thin film is formed prior to the thick film formation, and since thick film forming step should generally be carried out prior to the through hole plating step. In contrast, in a process not using a thick film, the process limitations as above need not be considered and plating after thin film formation is preferable since the etching process for the thin film does not affect the plating layer. In the process in FIG. 12, a polyimide layer is formed as an insulating layer between thin film conductors to prevent pin holes which may be formed in an inorganic insulating layer. A Ni-An plating step is then carried out to provide soldering pads, wire bonding pads, etc., on the thin film circuit elements on both surfaces of the substrate. The following processes may be the same as described before.

Figure 13:
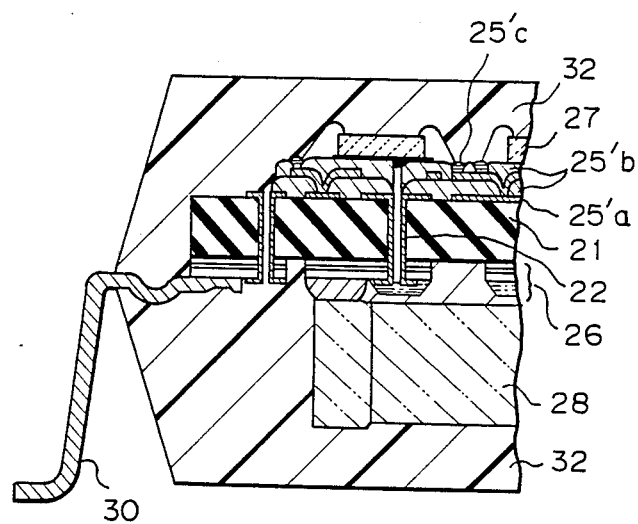
FIG. 13 is s sectional side view of a hybrid integrated circuit device according to a further embodiment of the present invention.

FIG. 13 illustrates an example of a hybrid integrated circuit comprising a thin film element on each surface of a substrate, in which reference numeral 21 denotes a ceramic substrate, 22 a plating through hole, 25' a first thin film circuit element, 25'a thin film conductor, 25'b a polyimide layer, 25'c a wire bonding pad, 26 a second thin film circuit element comprising film resistors and a wiring layer, 27 a semiconductor IC chip, 28 a discrete capacitor, 30 an outer lead, 32 a molding resin package, and 33 wires for electrically connecting electrodes of the semiconductor chip 27 to the wire bonding pad 25'c of the first thin film circuit element 25'.

Here, it should be noted that the above descriptions with reference to FIGS. 1 to 12 are only examples and are described for illustrative purposes only. For example, the process in FIGS. 6 and 11 can be modified within the scope stated in the claims.

We claim:

1. A hybrid integrated circuit device, comprising:
   an insulating substrate having two parallel main surfaces, at least one of said two main surfaces having a smooth surface adopted for formation of a thin film circuit thereon, and having a thin film formed thereon, said insulating substrate being provided with piercing holes penetrating from one to the other of said two main surfaces and having a diameter of less than 0.2 mm, the surface of said piercing holes being roughened so that the electroless plated metal layer can be firmly formed thereon;

first and second film circuits formed on said two main surface of said substrate, the one of said first and second film circuits formed on said at least one roughened surface of said two main surfaces of said substrate being a thick film circuit;

an electroless plated metal layer formed on the roughened surface of said piercing holes and electrically connected to said first and second film circuits; and a semiconductor chip mounted on at least one of said first and second film circuits.

2. A device according to claim 1, wherein said second film circuit is a thin film circuit and said first film circuit is a multilayer circuit.

3. A device according to claim 2, wherein said first film circuit is a thin film circuit.

4. A device according to claim 2, wherein said first film circuit is a thick film circuit.

5. A device according to claim 2, wherein said second film circuit of thin film comprises resistances in the form of a thin film and an interconnection layer connecting said resistances.

6. A device according to claim 2, wherein discrete capacitor elements are provided on said second film circuit.

7. A device according to claim 2, wherein discrete semiconductor chips are provided on said first 8. A device according to claim 1, wherein at least one of said first and second film circuits has outer lead terminals, outer leads being connected to said outer lead terminals.

9. A device according to claim 8, wherein said hybrid integrated circuit device has a plastic package formed by transfer molding from which package said outer leads extend.

10. A device according to claim 9, wherein said outer leads have a U-shaped bent portion near said outer lead terminals in the plastic package.

11. A device according to claim 1, wherein said insulating substrate is made of ceramics glass, glass ceramics or glass-coated ceramics.

12. An injection molded hybrid integrated circuit device, comprising:

an insulating substrate having two parallel main surfaces adopted for formation of a thin film circuit thereon and piercing holes penetrating from one to the other of said two main surfaces and having a diameter of less than 0.2 mm, the surfaces of one of said two main surfaces and said piercing holes being roughened to enable the formation of a thick film circuit or electroless plating layer;

a thick film circuit having more than one conductive layer and formed on said roughened main surface of said substrate;

semiconductor chips mounted on and electrically connected to said thick film circuit;

a thin film circuit formed on said other one of said two main surfaces of said substrate, said thin film comprising resistance elements in the form of a film and an interconnection layer electrically connecting the resistance elements;

discrete capacitor elements mounted on and electrically connected to said thin film circuit;

outer lead terminals provided along the periphery of said substrate and electrically connected to at least one of said thick and thin film circuits;

outer leads electrically connected to said outer lead terminals;

a transfer molded plastic package formed around said substrate, said thick and thin film circuits, said semiconductor chips and said capacitor elements, said outer lead extending out of said plastic package.

13. A device according to claim 12, wherein said insulating substrate is made of ceramics glass, glass ceramics on glass-coated ceramics.

* * * * *